(12) United States Patent
Moore et al.

(10) Patent No.: US 12,164,002 B2
(45) Date of Patent: Dec. 10, 2024

(54) TIME-TO-DIGITAL CONVERTER CIRCUIT WITH SELF-TESTING FUNCTION

(71) Applicant: STMicroelectronics International N.V., Geneva (CH)

(72) Inventors: John Kevin Moore, Edinburgh (GB); Gavin Stuart Ball, Penicuik (GB)

(73) Assignee: STMicroelectronics International N.V., Geneva (CH)

( * ) Notice: Subject to any disclaimer, the term of this patent is extended or adjusted under 35 U.S.C. 154(b) by 123 days.

(21) Appl. No.: 18/066,783

(22) Filed: Dec. 15, 2022

(65) Prior Publication Data
US 2024/0201255 A1    Jun. 20, 2024

(51) Int. Cl.
*G01R 31/317* (2006.01)
*G04F 10/00* (2006.01)

(52) U.S. Cl.
CPC .  *G01R 31/31726* (2013.01); *G01R 31/31703* (2013.01); *G01R 31/31727* (2013.01); *G04F 10/005* (2013.01)

(58) Field of Classification Search
CPC ........ G01R 31/31703; G01R 31/31726; G01R 31/31727
See application file for complete search history.

(56) References Cited

U.S. PATENT DOCUMENTS

| | | | | |
|---|---|---|---|---|
| 8,830,110 B1* | 9/2014 | Choi | ...................... | G04F 10/005 341/166 |
| 11,870,444 B1* | 1/2024 | You | ........................ | H03K 19/21 |
| 2009/0175399 A1* | 7/2009 | Sun | ........................ | H03L 7/0802 375/376 |
| 2009/0219187 A1* | 9/2009 | Sun | ........................ | G04F 10/005 341/166 |
| 2010/0085239 A1* | 4/2010 | Langfield | ................ | G01S 7/487 342/94 |
| 2010/0097150 A1* | 4/2010 | Ueda | ........................ | H03L 7/089 331/25 |
| 2012/0056769 A1* | 3/2012 | Wang | ..................... | G04F 10/005 341/166 |
| 2012/0249198 A1* | 10/2012 | Sinha | ...................... | H03L 7/089 327/157 |
| 2013/0211758 A1* | 8/2013 | Prathapan | ............... | H03L 7/091 702/66 |
| 2014/0312962 A1* | 10/2014 | Kao | .................... | H03K 17/9622 327/517 |
| 2015/0248114 A1* | 9/2015 | Chien | .................... | H03K 5/133 341/166 |
| 2015/0268633 A1* | 9/2015 | Chou | .................... | G04F 10/005 341/166 |
| 2017/0115381 A1* | 4/2017 | Moore | ................... | G01S 7/4861 |
| 2019/0052278 A1* | 2/2019 | Pandita | ..................... | H03L 7/18 |
| 2019/0280649 A1* | 9/2019 | Janardhanan | ........... | H03L 7/085 |

(Continued)

*Primary Examiner* — Lam T Mai
(74) *Attorney, Agent, or Firm* — Slater Matsil, LLP

(57) ABSTRACT

A time-to-digital converter (TDC) circuit with self-testing function includes: a D flip-flop, where an input terminal of the D flip-flop is configured to be coupled to a data signal, and a clock terminal of the D flip-flop is configured to be coupled to a clock signal; and an AND gate, where a first input terminal of the AND gate is configured to be coupled to an enable signal of the TDC circuit, a second input terminal of the AND gate is configured to be coupled to a test signal, and an output terminal of the AND gate is coupled to a control terminal of the D flip-flop.

20 Claims, 6 Drawing Sheets

(56) References Cited

U.S. PATENT DOCUMENTS

| | | | |
|---|---|---|---|
| 2019/0288694 A1* | 9/2019 | Parekh | H03L 7/143 |
| 2019/0339651 A1* | 11/2019 | Yao | H03L 7/085 |
| 2019/0348989 A1* | 11/2019 | Janardhanan | G04F 10/005 |
| 2021/0050859 A1* | 2/2021 | Sicurella | H03K 3/0315 |
| 2022/0006459 A1* | 1/2022 | Bautista Gabriel | G01R 19/16552 |
| 2022/0200608 A1* | 6/2022 | Wu | H03L 7/197 |
| 2023/0102825 A1* | 3/2023 | Lachartre | H03L 7/093 327/156 |
| 2023/0370746 A1* | 11/2023 | Ozawa | H03M 1/50 |
| 2024/0137671 A1* | 4/2024 | Lee | H04N 25/46 |

\* cited by examiner

TIME-TO-DIGITAL CONVERTER CIRCUIT WITH SELF-TESTING FUNCTION

TECHNICAL FIELD

The present invention relates generally to time-to-digital converter (TDC) circuits, and, in particular embodiments, to TDC circuits having self-testing function and time-of-flight (ToF) imagers having the disclosed TDC circuits.

BACKGROUND

Time-of-flight (ToF) imagers (also referred to as ToF sensors) have been widely used recently for various applications, such as gesture/facial recognition, light detection and ranging (LiDAR), virtual reality, augmented reality, and autonomous robotics. To measure an object, the ToF sensor sends a light signal towards the object and measures the time taken by the signal to travel to the object and back.

Single photon avalanche diode (SPAD) may be used as a detector of reflected light. In general, an array of SPADs is provided as a sensor (e.g., an SPAD array) in order to detect a reflected light pulse. A reflected photon may generate a carrier in the SPAD through the photo electric effect. The photo-generated carrier may trigger an avalanche current in one or more of the SPADs in an SPAD array. The avalanche current may signal an event, namely that a photon has been detected. Information related to the reflected intensity, also referred to as "signal count," is output as histograms of the SPAD array. The histogram for each SPAD includes a plurality of histogram bins, where each histogram bin corresponds to a distance (or a narrow range of distance) from the SPAD array, and the value (e.g., signal count) of each histogram bin corresponds to the number of detected avalanche current events (e.g., number of detected photons). The histogram from the SPAD is processed to extract useful information, such as the number of targets detected, the distance of the targets, and so on.

The time-to-digital converter (TDC) within the ToF sensor samples the pulses from the SPAD (which correspond to the avalanche current events) using a clock signal. From these samples, the histogram is produced, providing counts of events that occur within given time intervals. The TDCs of the ToF sensor need to be tested, e.g., as part of the quality control (QC) process during manufacturing or in the field after being deployed, to ensure that they function properly. There is a need in the art for TDC circuits that can provide simple, accurate self-testing with lower power consumption without degrading the ranging performance.

SUMMARY

In accordance with an embodiment, a time-to-digital converter (TDC) circuit with self-testing function includes: a D flip-flop, where an input terminal of the D flip-flop is configured to be coupled to a data signal, and a clock terminal of the D flip-flop is configured to be coupled to a clock signal; and an AND gate, where a first input terminal of the AND gate is configured to be coupled to an enable signal of the TDC circuit, a second input terminal of the AND gate is configured to be coupled to a test signal, and an output terminal of the AND gate is coupled to a control terminal of the D flip-flop.

In accordance with an embodiment, a time-to-digital converter (TDC) circuit with self-testing function comprises a sampling stage. The sampling stage includes: first plurality of D flip-flops, wherein first input terminals of the first plurality of D flip-flops are configured to be coupled to a data signal, wherein first clock terminals of the first plurality of D flip-flops are configured to be coupled to respective ones of a plurality of clock signals, wherein the plurality of clock signals have a same frequency but different phases; and a plurality of AND gates, wherein first input terminals of the plurality of AND gates are configured to be coupled to an enable signal, wherein second input terminals of the plurality of AND gates are configured to be coupled to respective ones of a plurality of test signals, wherein output terminals of the plurality of AND gates are coupled to respective ones of control terminals of the first plurality of D flip-flops.

In accordance with an embodiment, a method of operating a time-to-digital converter (TDC) circuit having a self-testing function includes, in a self-test mode of the TDC circuit, operating the TDC circuit by: keeping an input terminal of a D flip-flop in an input stage of the TDC circuit in a logic low state; sending a clock signal to a clock terminal of the D flip-flop; keeping an enable signal at a first input terminal of an AND gate in a logic high state, wherein an output terminal of the AND gate is coupled to a control terminal of the D flip-flop; and generating a pulse at a second input terminal of the AND gate at a pre-determined time instant.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
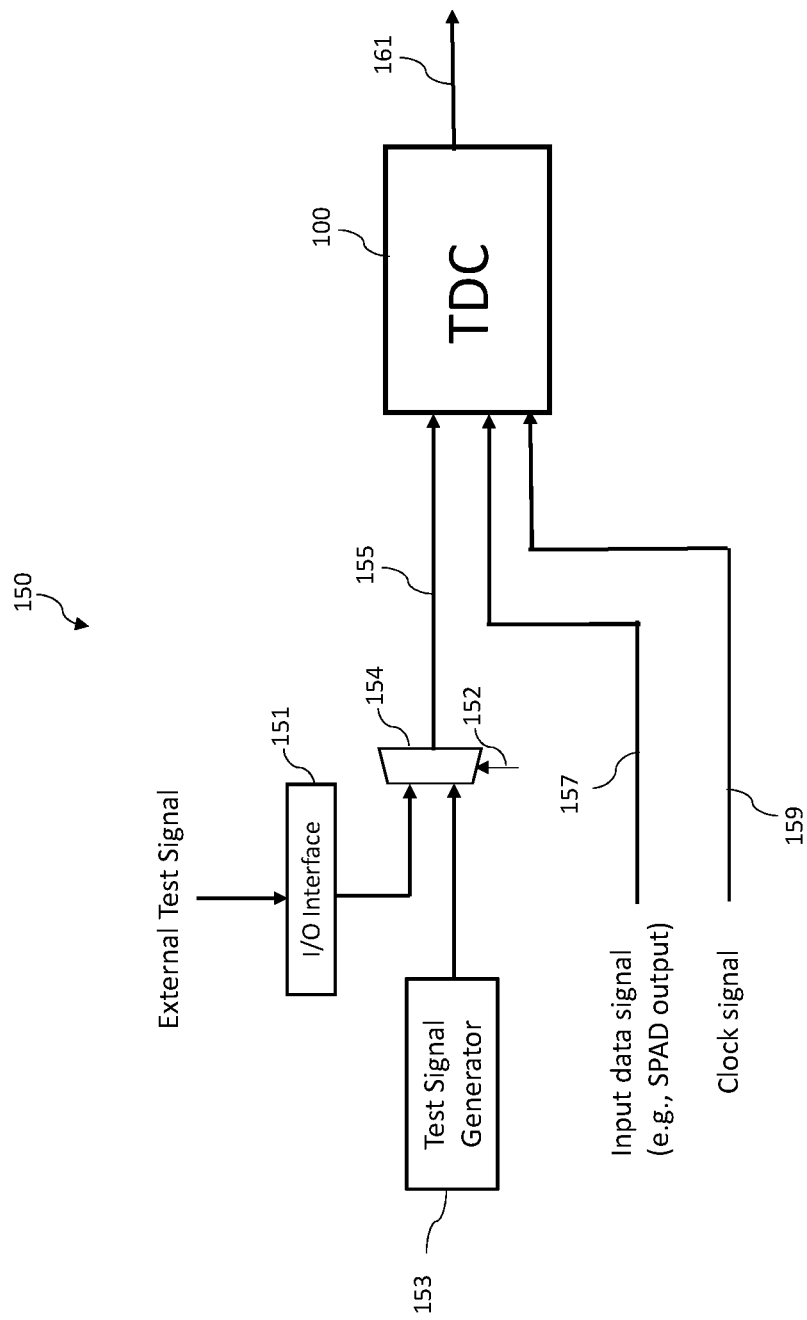
FIG. 1 illustrates a block diagram of a time-to-digital converter (TDC) circuit with self-testing function, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component.

The present disclosure will be described with respect to examples in a specific context, namely TDC circuits with self-testing function and ToF imagers comprising the disclosed TDC circuits.

FIG. 1 illustrates a block diagram of a time-to-digital converter (TDC) circuit 150 with self-testing function, in an embodiment. The TDC circuit 150 includes a TDC core 100

(also referred to as TDC 100 herein) and peripheral circuits (e.g., test signal generator 153, input/output (I/O) interface 151, and multiplexer 154). During the normal operation mode (e.g., for sampling the input data signal to generate histogram for SPAD output) of the TDC circuit 150, the TDC core 100 performs the function of sampling an input data signal (e.g., output from a SPAD) using a clock signal. The input data signal is sent to the TDC core 100 through a data path 157, and the clock signal is sent to the TDC core 100 through a data path 159. The output data of the TDC core 100 are samples of the input data signal, in some embodiments. The output of the TDC core 100 is sent out through an output data path 161.

During the self-test mode, the TDC core 100 accepts a test signal through a data path 155. The test signal has a pre-determined test pattern (e.g., having pulses at pre-determined time instants), which forces the output of the TDC core 100 to have an expected data pattern. The test signal (e.g., a digital signal) may be generated by a test signal generator 153 of the TDC circuit 150, or may be an external test signal (e.g., generated by a circuit external to the TDC circuit 150) received through an input/output (I/O) interface 151 (e.g., a general purpose input/output (GPIO) interface). A multiplexer (MUX) 154 may be used to select which test signal (e.g., test signal from the test signal generator 153 or from the I/O interface 151) to use for the self-test, based on a control signal 152 of the MUX 154.

In some embodiments, during the self-test mode, the actual output of the TDC core 100 is compared with the expected output (e.g., the expected output of the TDC core 100 in response to the test signal with the pre-determined test pattern), and a discrepancy between the actual output and the expected output indicates that the TDC core 100 is faulty (e.g., not functioning properly). Details of the TDC core 100 and various operation modes (e.g., normal mode, self-test mode) are discussed hereinafter.

In FIG. 1, the data path 155 (or 159, or 161) may be a data bus, which supports multiple, parallel digital signals to be transmitted on the data bus. For example, the clock signal may be a multi-phase clock signal with, e.g., eight different phases, and the data path 159 may be a data bus having a total of, e.g., eight signal lines to transmit eighth clock signals with different phases. Similarly, the data path 155 may be a data bus having a total of, e.g., eight signal lines to transmit eight different test signals. Details are discussed below with reference to FIG. 2.

Figure 2:
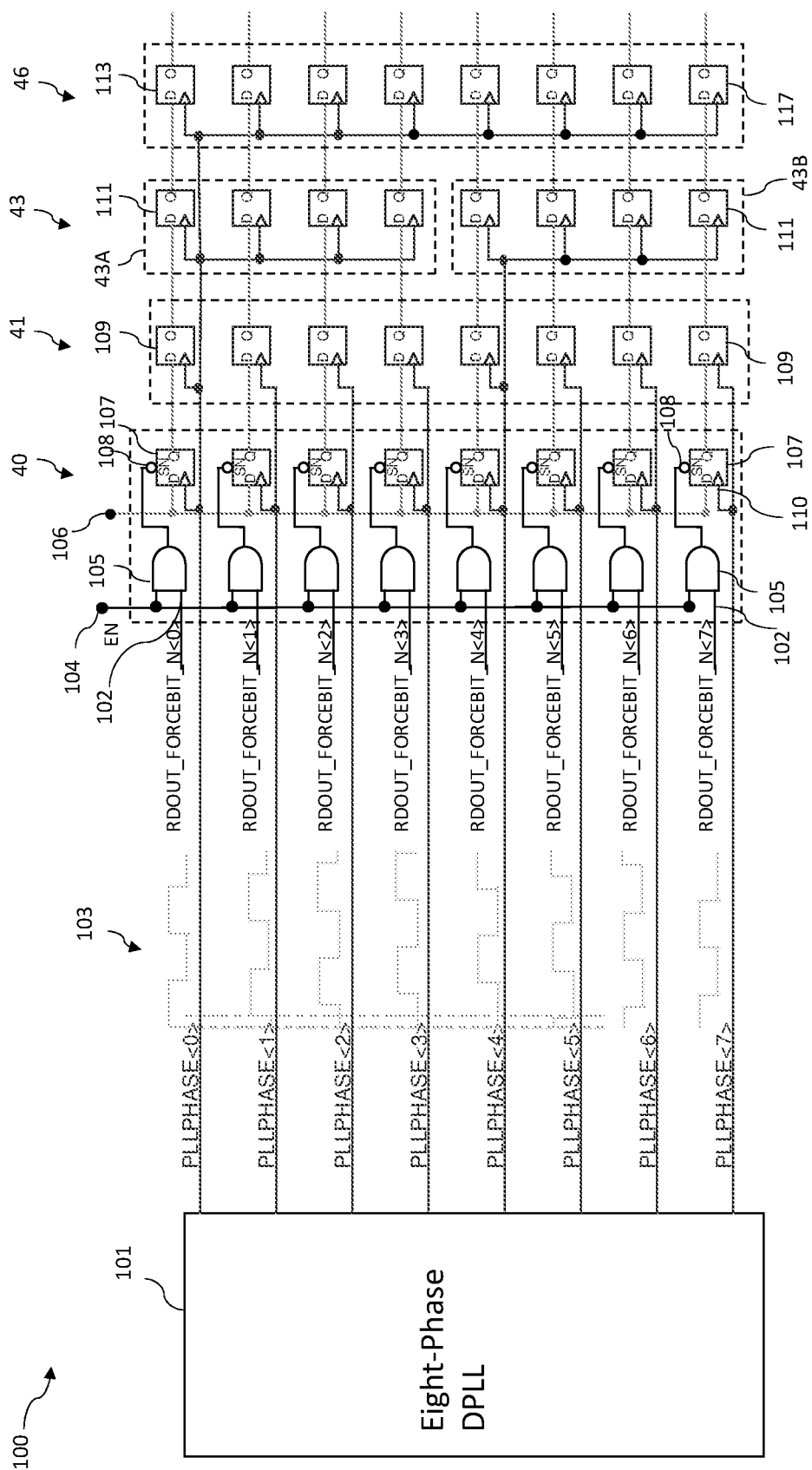
FIG. 2 illustrates a schematic view of a time-to-digital converter (TDC), in an embodiment.

FIG. 2 illustrates a schematic view of the time-to-digital converter (TDC) 100 of FIG. 1, in an embodiment. In FIG. 2, an eight-phase digital phase-locked loop (DPLL) circuit 101 generates eight clock signals 103 having the same clock frequency but different phases (also referred to as clock phases). The clock signals 103 are labeled as PLLPHASE<n>, where n=0, 1, 2, ..., 7, to indicate the different phases of the clock signals 103. For example, the eight-phase DPLL circuit 101 may generate eight clock signals 103 having the same clock frequency of 1 GHz, but with a phase offset of ⅛ of 2π between two adjacent clock signals, where 2π is the phase corresponding to a clock cycle (e.g., a period) of the clock signal. In other words, the timing offset between two adjacent clock signals 103 is ⅛ of a clock cycle. The multi-phase clock signals 103 allow the hardware (e.g., D flip-flops) to be clocked (e.g., running) at a lower frequency (e.g., 1 GHz) for reduced hardware cost/complexity and power consumption, while achieving a timing accuracy of a higher clock signal (e.g., an 8 GHz clock signal). In some embodiments, the eight-phase DPLL circuit 101 receives an input clock signal from, e.g., a time/clock generator (see 205 in FIG. 5), and based on the input clock signal, generates the clock signals 103 with different phases. Note that the eight-phase DPLL circuit 101 may or may not be part of the TDC 100. In some embodiments, the eight-phase DPLL circuit 101 is part of the TDC 100. In some embodiments, the eight-phase DPLL circuit 101 is not part of the TDC 100, and the TDC 100 receives the clock signals 103 which are externally provided clock signals.

Note that the number of clock phases illustrated in FIG. 2 is merely a non-limiting example, other number of clock phases are possible and are fully intended to be included within the scope of the present disclosure. Skilled artisans, upon reading the disclosure herein, would readily be able to adapt the example disclosed herein for clock signals having different numbers of phases. In addition, besides digital phase-locked loops, other types of phase-locked loops, such as analog phase-locked loops (e.g., an analog PLL with digital circuits in the feedback loop), may also be used in place of the eight-phase DPLL circuit 101. These and other variations are fully intended to be included within the scope of the present disclosure.

In FIG. 2, the TDC 100 includes four sampling stages: a sampling stage 40 (also referred to as an input stage 40), a re-sampling stage 41, a first synchronization stage 43, and a second synchronization stage 46. The dashed boxes in FIG. 2 illustrate the boundaries of each of the sampling stages. Note that the first synchronization stage 43 includes circuits disposed within two dashed boxed 43A and 43B.

The sampling stage 40 is designed to accommodate the self-testing function. In the example of FIG. 2, the sampling stage 40 includes a plurality of D flip-flops 107, where each D flip-flop 107 functions as a sampling element to sample the input data signal applied at the input terminal (e.g., the D terminal) of the D flip-flop 107. Note that the input terminals of the D flip-flops 107 in the sampling stage 40 are connected together to an input terminal 106 of the TDC 100. The input data signal (e.g., output from a SPAD) to the TDC 100 is coupled to the input terminal 106 (e.g., through the data path 157 in FIG. 1).

Each of the D flip-flops 107 in the sampling stage 40 is clocked by a respective clock signal 103. As discussed above, each of the eight D flip-flops 107 samples the input data signal at the same clock frequency (e.g., 1 GHz) but at a different clock phase, thereby achieving a higher timing resolution equivalent to that of a higher clock signal (e.g., an 8 GHz clock signal). The multi-phase clock signals 103 are sent to the TDC 100 through, e.g., the data path 159 in FIG. 1.

Still referring to FIG. 2, each of the D flip-flops 107 is coupled to a corresponding AND gate 105. The first input terminal of each of the AND gates 105 is connected to an enable terminal 104 of the TDC 100. The enable terminal 104 is configured to receive an enable signal (e.g., a high-active enable signal) of the TDC 100. The second input terminal 102 of each of the AND gates 105 is coupled to a respective test signal, labeled as RDOUT_FORCEBIT_N<n>, where n=0, 1, 2, ..., or 7 in FIG. 2. The test signals are sent to the TDC 100 through, e.g., the data path 155 in FIG. 1. The output of each AND gate 105 is coupled to a control terminal 108 of a respective D flip-flop 107. In the illustrated embodiment, the control terminal 108 is a low-active SET terminal of the D flip-flop 107, meaning that when the signal applied at the control terminal 108 has a logic low value (e.g. a logic zero value), the output of the D flip-flop 107 is set to a logic high value (e.g., a logic one value). For ease of discussion herein, when the signal at a terminal (e.g., an input terminal or an output terminal) of a device has a logic low value (or logic high value), the terminal is also said to be in a logic low state (or logic high state). The discussion herein may use the term "logic high value" (or "logic low value") interchangeably with the term "logic high state" (or "logic low state").

In some embodiments, to operate the TDC 100 in the normal operation mode, the input data signal (e.g., SPAD output) is applied at the input terminal 106, the enable signal applied at the enable terminal 104 is set to the logic high value, and the test signals RDOUT_FORCEBIT_N<n>, n=0, 1, 2, . . . , and 7, are all set to the logic high value. As a result, the output of each AND gate 105 has a logic high value (e.g., a non-active state for the SET terminal), and each of the D flip-flop 107 samples the input data signal at the effective edge (e.g., the rising edge or the falling edge) of its respective clock signal PLLPHASE<n>, where n=0, 1, 2, . . . , or 7.

In some embodiments, to operate the TDC 100 in the self-test mode, the input terminal 106 is set to the logic low value (e.g., by setting the input data signal to the logic low value in self-test mode), and the enable signal applied at the enable terminal 104 is set to the logic high value. The output of each AND gate 105 is determined by the respective test signals RDOUT_FORCEBIT_N<n>, where n=0, 1, 2, . . . , or 7. For example, if the test signal RDOUT_FORCEBIT_N<n> has a logic high value, the output of the AND gate 105 has a logic high value, and therefore, the output of the corresponding D flip-flop 107 will have a logic low value at the next effective edge (e.g., rising edge or falling edge) of the respective clock signal PLLPHASE<n>. Conversely, if the test signal RDOUT_FORCEBIT_N<n> has a logic low value, the output of the AND gate 105 has a logic low value (e.g., an active state for the SET terminal), and therefore, the output of the corresponding D flip-flop 107 is set to a logic high value.

As discussed above, in the self-test mode, the output of each of the D flip-flops 107 can be controlled precisely by setting the test signal RDOUT_FORCEBIT_N<n> to the logic high value or logic low value at pre-determined (e.g., user defined) time instants. By switching the test signal RDOUT_FORCEBIT_N<n> from the logic high value to the logic low value at pre-determined time instants, the output of the respective D flip-flop 107 changes from the logic low value to the logic high value at the pre-determined time instants, and vice versa. Switching the test signal RDOUT_FORCEBIT_N<n> back and forth between the logic high value and the logic low value at pre-determined time instants may also be referred to as generating pulses with user specified pulse widths in the test signal at pre-determined time instants.

As discussed above, the sampling stage 40 accommodates the normal operation mode and the self-test mode. Operation of the re-sampling stage 41, the first synchronization stage 43, and the second synchronization stage 46 is the same in the normal operation mode and the self-test mode, and is discussed next.

Still referring to FIG. 2, the re-sampling stage 41 includes a plurality of D flip-flops 109. The input terminal (e.g., D terminal) of each D flip-flop 109 is coupled to the output terminal of a respective D flip-flop 107 in the sampling stage 40, and each D flip-flop 109 and the respective D flip-flop 107 are clocked by the same clock signal RDOUT_FORCEBIT_N<n>. The re-sampling stage 41 may advantageously be included to re-sample the outputs of the sampling stage 40 under the same phases to help avoid metastable (mid-rail) conditions, such as when the digital signal goes high at the same time as a clock signal, for example.

The re-sampled outputs from the re-sampling stage 41 are provided to the first synchronization stage 43, which includes a plurality of D flip-flops 111. The input terminal (e.g., D terminal) of each D flip-flop 111 is coupled to the output terminal of a respective D flip-flop 109 in the re-sampling stage 41. The first synchronization stage 43 is configured to synchronize a first subset of the outputs (e.g., outputs from the first four D-flip flops 109) from the re-sampling stage 41 to a first dock signal (e.g., PLLPHASE<0>) of the plurality of clock signals 103, and is configured to synchronize a second subset of the outputs (e.g., outputs from the last four D flip-flops 109) from the re-sampling stage 41 to a second clock signal (e.g., PLLPHASE<4>) of the plurality of clock signals 103. In the illustrated embodiment, the phase difference between the first clock signal (e.g., PLLPHASE<0>) and the second clock signal (e.g., PLLPHASE<4>) is $\pi$, which corresponds to a timing difference of half of a clock cycle.

Still referring to FIG. 2, the second synchronization stage 46 is coupled to the first synchronization stage 43. The second synchronization stage 46 includes a plurality of D flip-flops 113. The input terminal (e.g., D terminal) of each D flip-flop 113 is coupled to the output terminal of a respective D flip-flop 111 in the first synchronization stage 43. The second synchronization stage 46 is configured to receive the synchronized outputs from the first synchronization stage 43, and synchronize all of the synchronized outputs from the first synchronization stage 43 to the first clock signal (e.g., PLLPHASE<0>) of the plurality of clock signals 103. The synchronized outputs (e.g., outputs of the D flip-flops 113) from the second synchronization stage 46 may be sent out directly (e.g., as eight parallel output signals) as the output of the TDC 100, or may be read out by a faster clock signal (e.g., an 8 GHz clock signal) as a single stream of output signal. The output of the TDC 100 is sent for further processing, such as for forming the histogram of the ToF sensor.

Figure 3:
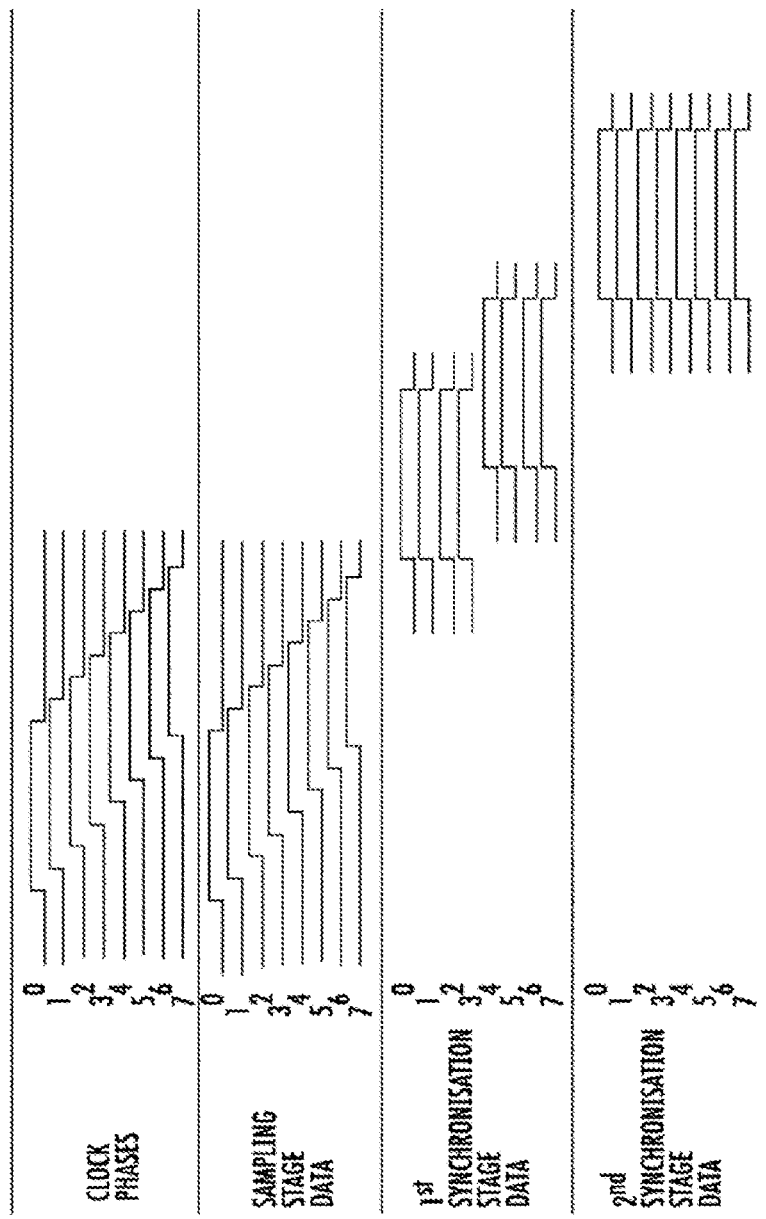
FIG. 3 illustrates a timing diagram for the TDC of FIG. 2, in an embodiment.

FIG. 3 illustrates a timing diagram for the TDC 100 of FIG. 2, in an embodiment. In FIG. 3, the signals labeled as CLOCK PHASES show the plurality of clock signals 103 with different phases. The signals labeled as SAMPLING STAGE DATA show the output signals of the sampling stage 40 (or the re-sampling stage 41). The signals labeled as 1st SYNCHRONISATION STAGE DATA show the output signals of the first synchronization stage 43. The signals labeled as $2^{nd}$ SYNCHRONISATION STAGE DATA show the output signals of the second synchronization stage 46.

Figure 4:
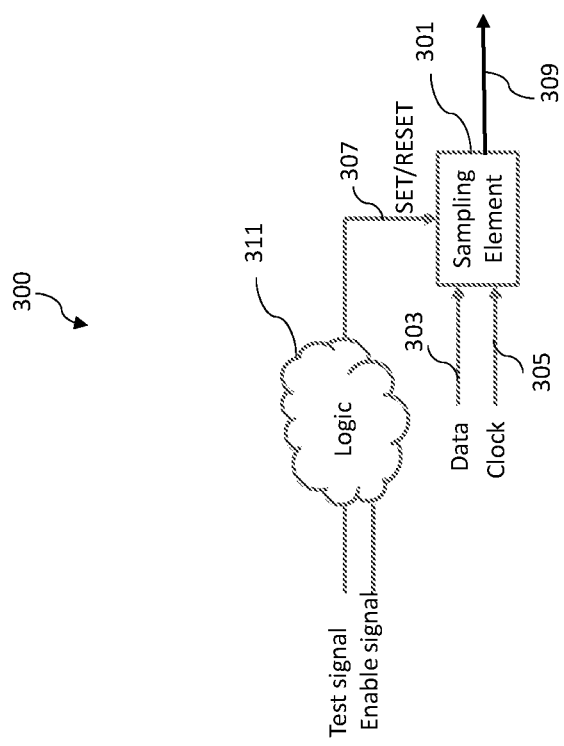
FIG. 4 illustrates a block diagram of a TDC, in another embodiment.

FIG. 4 illustrates a block diagram of a TDC 300, in another embodiment. The block diagram in FIG. 4 is a more generic representation of the TDC 100 of FIG. 2. For simplicity, the block diagram of FIG. 4 only shows a portion of the TDC 300. For example, the block diagram of FIG. 4 may correspond to the circuits in the input stage (see, e.g., input stage 40 in FIG. 2) of the TDC 300 and may correspond to circuits used for one of the clock phases (e.g., PLLPHASE<n> in FIG. 2).

As illustrated in FIG. 4, the TDC 300 includes a sampling element 301, which may be a D flip-flop, or other suitable sampling device. An input terminal 303 of the TDC 300 is configured to receive an input data signal (e.g., an output signal from a SPAD), and a clock terminal 305 is configured to receive a sampling clock signal. A control terminal 307 (also referred to as a SET/RESET terminal) of the TDC 300 is configured to be coupled to an output of a logic circuit 311. The SET/RESET terminal 307, when set into an active state (e.g., having a logic high value or a logic low value, depending on the definition of the active state of the SET/RESET terminal), sets (or resets) the output of the sampling element 301. The logic circuit 311 may include logic gates (e.g., AND gate, OR gate, XOR gate, combinations thereof, or the like) that generates a control signal for the control terminal 307 based on the input signals of the logic circuit 311. The input signals of the logic circuit 311 may include a test signal and an enable signal, as an example.

In some embodiments, to operate the TDC 300 in the normal operation mode, the input signals to the logic circuit 311 are chosen to generate a control signal that sets the SET/RESET terminal 307 of the sampling element 301 in an inactive state, and therefore, the sampling element 301 samples the input data signal using the sampling clock signal.

In some embodiments, to operate the TDC 300 in the self-test mode, the input data signal applied at the input terminal 303 is set to a first logic value that is opposite to a second logic value at the output of the sampling element 301 when the SET/RESET terminal 307 is in the active state. For example, if the SET/RESET terminal 307 sets the output of the sampling element 301 to the logic high value when active, then in the self-test mode, the input data signal applied at the input terminal 303 is set to the logic low value; and vice versa. The input signals to the logic circuit 311 are chosen to generate a control signal that sets the SET/RESET terminal 307 in the active state at pre-determined time instants for pre-determined durations, which will force the output of the sampling element 301 to the set value or reset value. Therefore, by controlling the control signal sent to the SET/RESET terminal 307, the output of the sampling element 301 can be controlled precisely. The actual output of the sampling element 301 during the self-test mode can be compared with the expected output signal (which is determined by the control signal applied to the SET/RESET terminal 307) to detect faulty conditions in the TDC 300.

Figure 5:
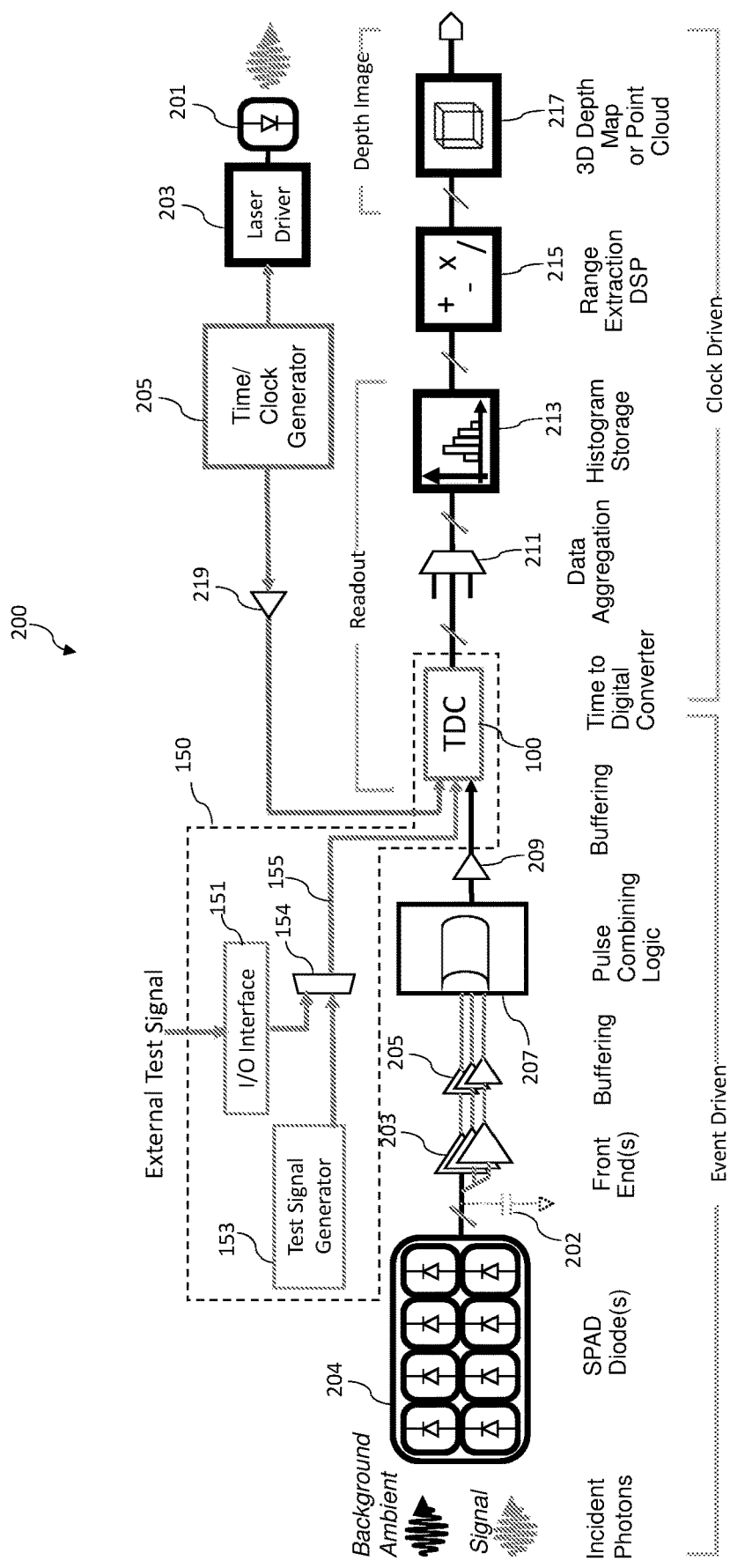
FIG. 5 illustrates a block diagram of a time-of-flight (ToF) imager, in an embodiment.

FIG. 5 illustrates a block diagram of a time-of-flight (ToF) imager 200, in an embodiment. The transmitter path of the ToF imager 200 includes a time/clock generator 205, a driver circuit 203, and an optical source 201. The time/clock generator 205 generates a first signal (e.g. a first frequency signal), which is processed (e.g., amplified, filtered, and/or voltage shifted) by the driver circuit 203 to generate a driving signal for the optical source 201. The optical source 201 generates output optical signal (e.g., laser pulses) based on the driving signal from the driver circuit 203. In the illustrated embodiment, the optical source 201 is a vertical-cavity surface-emitting laser (VCSEL) diode, and the driver circuit 203 is a VCSEL driver circuit. These are, of course, non-limiting examples, and other types of optical source and driver circuit may also be used. The time/clock generator 205 also generates a dock signal (e.g., a 1 GHz clock signal), which is buffered/amplified by a buffer 219 and sent to the TDC 100 as the clock signal.

Still referring to FIG. 5, the reflected optical signals and ambient signals are received by the receiving path of the ToF imager 200, which includes a SPAD array 204, buffers 203/205/209, a pulse combining logic circuit 207, a TDC 100, and a data aggregation circuit 211. The receiving path of ToF imager 200 may also include memory modules 213 for storing the histogram data. FIG. 5 further illustrates signal processing modules 215 and 217 for processing the histogram to extract and form useful information such as number of targets, range of targets, and 3D depth map, as examples. The signal processing modules 215 and 217 may be formed as part of the ToF image 200, e.g., by integrating a digital signal processor (DSP), a micro-controller (MCU), or an application-specific integrated circuit (ASIC) in the ToF imager 200. In other embodiments, the signal processing modules 215 and 217 are formed outside of the ToF imager 200.

Each of the SPAD in the SPAD array 204 generates an output signal with pulses indicating, e.g., the detection of photons. The output signal of each SPAD is buffered and/or amplified by the buffers 203/205. FIG. 5 illustrates a parasitic component 202 (e.g., a parasitic capacitor) in phantom. The output signals from multiple SPADs may be combined together by the pulse combining logic circuit 207, which may be or include an adder tree (e.g., for adding the output signals from the multiple SPADs), an OR tree (e.g., for performing a logic OR operation on the output signals from the multiple SPADs), or the like. The output of the pulse combining logic circuit 207 is buffered by the buffer 209, then sent to the TDC 100 as the input data signal. Note that FIG. 5 also illustrate the test signal generator 153 and the I/O interface 151, which together with the TDC 100 and the MUX 154, form the TDC circuit 150. The output of the TDC 100 is aggregated with output from other sensors (e.g., output for another SPAD array), and the aggregated output is used to generate the histogram.

In some embodiments, at least portions of the ToF imager 200 disclosed herein may be integrated on a semiconductor substrate (e.g., silicon) to form an integrated circuit (IC) die, also referred to as a semiconductor die. For example, the IC die may include all functional blocks of the ToF imager 200, or all functional blocks except certain components, such as the optical source 201 (e.g., the laser diode). In addition, some of the functional blocks (e.g., signal processing modules 215, 217) of the ToF imager 200 may be implemented as software functional blocks running on, e.g., a processor, which processor may be integrated as part of the IC die of the ToF imager 200, or may be a stand-alone processor connected to the IC die of the ToF imager 200.

Figure 6:
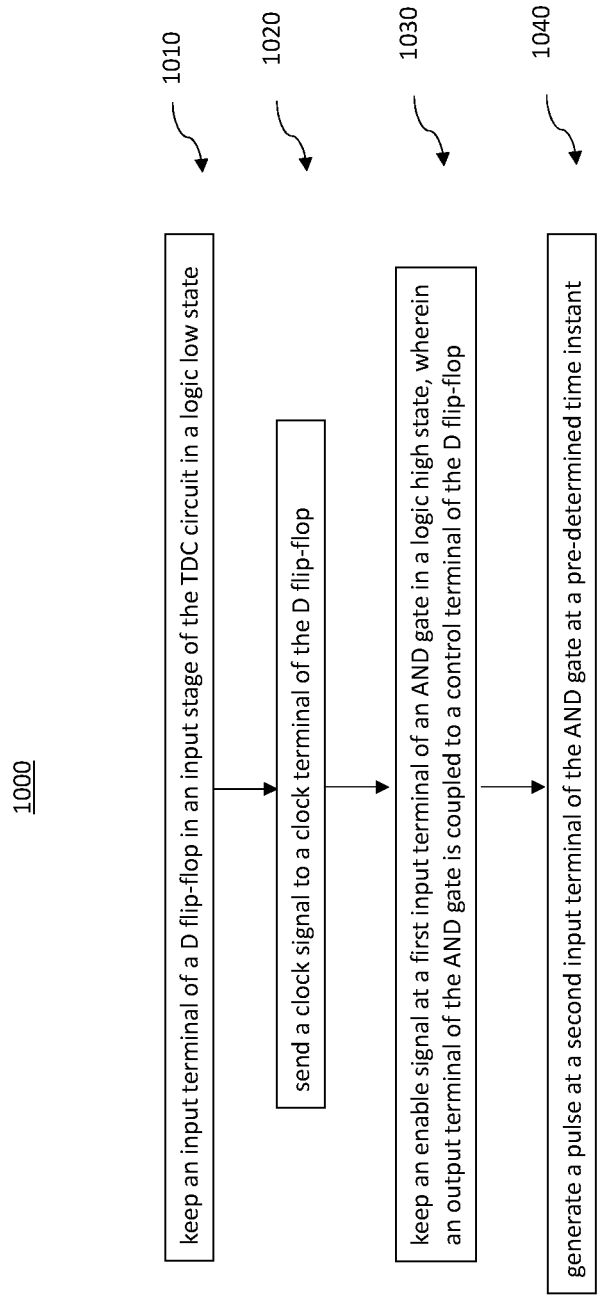
FIG. 6 illustrates a flow chart of a method of operating a TDC circuit having a self-testing function, in some embodiments.

FIG. 6 illustrates a flow chart of a method 1000 of operating, in a self-test mode, a time-to-digital converter (TDC) circuit having a self-testing function. It should be understood that the example method shown in FIG. 6 is merely an example of many possible example methods. One of ordinary skill in the art would recognize many variations, alternatives, and modifications. For example, various steps as illustrated in FIG. 6 may be added, removed, replaced, rearranged, or repeated.

Referring to FIG. 11 at block 1010, an input terminal of a D flip-flop in an input stage of the TDC circuit is kept in a logic low state. At block 1020, a clock signal is sent to a clock terminal of the D flip-flop. At block 1030, an enable signal at a first input terminal of an AND gate is kept in a logic high state, wherein an output terminal of the AND gate is coupled to a control terminal of the D flip-flop. At block 1040, a pulse is generated at a second input terminal of the AND gate at a pre-determined time instant.

Embodiments may achieve advantages as described below. To appreciate the advantage of the present disclosure, consider a reference TDC design where the input data signal (e.g., SPAD output signal) is inverted and sent to a first input terminal of an XNOR gate, and a test signal is sent to a second input terminal of the XNOR gate. The output of the XNOR gate is sent to the input terminal (e.g., the D terminal) of the D flip-flop 107. When the reference TDC design works in the normal operation mode, the test signal is set to the logic low value, and the XNOR gate allows the input data signal to pass through. Similarly, when the reference TDC design works in the self-test mode, the input data signal is set to the logic high value, and the XNOR gate allows the test signal to pass through (e.g., due to the inverted input data signal being at logic low value). Since the XNOR gate is placed in the timing critical path, the XNOR gate may introduce distortion to the input data signal, e.g., by introducing delays, changing the rise/fall time of the input data signal, or changing the pulse widths of the input data signal, thereby reducing the performance of the TDC reference design. In addition, since the output of the XNOR gate is toggling (e.g., output signal changing values) at the TDC input data rate (e.g., hundreds of megahertz to gigahertz) during the normal operation mode, the XNOR gate (which is used to accommodate the self-test mode) consumes considerable amount of energy during the normal operation mode. In contrast, in the disclosed embodiments, the test signal is applied to a control terminal (e.g., a SET terminal) of the D flip-flop 107 through the AND gate 105. The AND gate 105 is not in the timing critical path, and the input data signal goes directly into the input terminal of the D flip-flop 107, thereby avoiding distortion to the input data signal. In addition, the input signals to the AND gate 105 are static during the normal operation, and therefore, the AND gate 105 outputs a static value (e.g., logic high) during the normal operation. Therefore, the power consumption of the AND gate 105 is negligible during the normal operation mode.

Examples of the present invention are summarized here. Other examples can also be understood from the entirety of the specification and the claims filed herein.

Example 1. In an embodiment, a time-to-digital converter (TDC) circuit with self-testing function includes: a D flip-flop, wherein an input terminal of the D flip-flop is configured to be coupled to a data signal, and a clock terminal of the D flip-flop is configured to be coupled to a clock signal; and an AND gate, wherein a first input terminal of the AND gate is configured to be coupled to an enable signal of the TDC circuit, a second input terminal of the AND gate is configured to be coupled to a test signal, and an output terminal of the AND gate is coupled to a control terminal of the D flip-flop.

Example 2. The TDC circuit of Example 1, wherein the control terminal of the D flip-flop is a low-active SET terminal that sets an output terminal of the D flip-flop to a logic high state when the control terminal is in a logic low state.

Example 3. The TDC circuit of Example 2, wherein during a self-test mode of the TDC circuit, the enable signal of the TDC circuit is configured to stay in the logic high state, the data signal is configured to stay in the logic low state, and the test signal is configured to changes from the logic high state to the logic low state at a first pre-determined time instant.

Example 4. The TDC circuit of Example 3, wherein during the self-test mode, the test signal is further configured to: after changing from the logic high state to the logic low state at the first pre-determined time instant, change from the logic low state to the logic high state at a second pre-determined time instant.

Example 5. The TDC circuit of Example 3, wherein during a normal operation mode of the TDC circuit, the enable signal of the TDC is configured to stay in the logic high state, and the test signal is configured to stay in the logic high state.

Example 6. The TDC circuit of Example 3, further comprising a test signal generator configured to generate the test signal.

Example 7. The TDC circuit of Example 6, further comprising an input/output (I/O) interface configured to receive an external test signal as the test signal.

Example 8. In an embodiment, a time-to-digital converter (TDC) circuit with self-testing function comprises a sampling stage. The sampling stage includes: first plurality of D flip-flops, wherein first input terminals of the first plurality of D flip-flops are configured to be coupled to a data signal, wherein first clock terminals of the first plurality of D flip-flops are configured to be coupled to respective ones of a plurality of clock signals, wherein the plurality of clock signals have a same frequency but different phases; and a plurality of AND gates, wherein first input terminals of the plurality of AND gates are configured to be coupled to an enable signal, wherein second input terminals of the plurality of AND gates are configured to be coupled to respective ones of a plurality of test signals, wherein output terminals of the plurality of AND gates are coupled to respective ones of control terminals of the first plurality of D flip-flops.

Example 9. The TDC circuit of Example 8, wherein the control terminals of the first plurality of D flip-flops are low-active SET terminals for setting output signals of the first plurality of D flip-flops to a logic high value when the SET terminals have a logic low value.

Example 10. The TDC circuit of Example 9, wherein during a self-test mode of the TDC circuit, the enable signal is configured to be at the logic high value, the data signal is configured to be at the logic low value, and the plurality of test signals are configured to generate pulses at pre-determined time instants.

Example 11. The TDC circuit of Example 10, wherein during a normal operation mode of the TDC circuit, the enable signal is configured to be at the logic high value, and the plurality of test signals are configured to be at the logic high value.

Example 12. The TDC circuit of Example 10, further comprising a test signal generator configured to generate the plurality of test signals.

Example 13. The TDC circuit of Example 10, further comprising: a re-sampling stage comprising second plurality of D flip-flops, wherein second input terminals of the second plurality of D flip-flops are coupled to respective output terminals of the first plurality of D flip-flops, wherein each of the second plurality of D flip-flops and a respective one of the first plurality of D flip-flops are clocked by a same respective clock signal of the plurality of clock signals.

Example 14. The TDC circuit of Example 13, further comprising: a first synchronization stage comprising third plurality of D flip-flops, wherein third input terminals of the third plurality of D flip-flops are coupled to respective output terminals of the second plurality of D flip-flops, wherein a first group of D flip-flops of the second plurality of D flip-flops are clocked by a first clock signal of the plurality of clock signals, and a second group of D flip-flops of the second plurality of D flip-flops are clocked by a second clock signal of the plurality of clock signals.

Example 15. The TDC circuit of Example 14, wherein a timing difference between the first clock signal and the second clock signal is equal to half of a clock cycle of the first clock signal.

Example 16. The TDC circuit of Example 14, further comprising: a second synchronization stage comprising fourth plurality of D flip-flops, wherein fourth input terminals of the fourth plurality of D flip-flops are coupled to respective output terminals of the third plurality of D flip-flops, wherein the fourth plurality of D flip-flops are clocked by the first clock signal.

Example 17. In an embodiment, a method of operating a time-to-digital converter (TDC) circuit having a self-testing function comprises, in a self-test mode of the TDC circuit, operating the TDC circuit by: keeping an input terminal of a D flip-flop in an input stage of the TDC circuit in a logic low state; sending a clock signal to a clock terminal of the D flip-flop; keeping an enable signal at a first input terminal of an AND gate in a logic high state, wherein an output terminal of the AND gate is coupled to a control terminal of the D flip-flop; and generating a pulse at a second input terminal of the AND gate at a pre-determined time instant.

Example 18. The method of Example 17, wherein the control terminal is a low-active SET terminal of the D flip-flop.

Example 19. The method of Example 18, further comprising: in a normal operation mode of the TDC circuit, operating the TDC circuit by: supplying a data signal to the input terminal of the D flip-flop; sending the clock signal to the clock terminal of the D flip-flop; keeping the enable signal at the first input terminal of the AND gate in the logic high state; and keeping the second input terminal of the AND gate in the logic high state.

Example 20. The method of Example 18, further comprising: collecting output signals of the TDC circuit during the self-test mode; comparing the collected output signals with expected output signals; and in response to detecting a difference between the collected output signals and the expected output signals, declaring that the TDC circuit is faulty.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A time-to-digital converter (TDC) circuit with self-testing function, the TDC circuit comprising:
   a D flip-flop, wherein an input terminal of the D flip-flop is configured to be coupled to a data signal, and a clock terminal of the D flip-flop is configured to be coupled to a clock signal; and
   an AND gate, wherein a first input terminal of the AND gate is configured to be coupled to an enable signal of the TDC circuit, a second input terminal of the AND gate is configured to be coupled to a test signal, and an output terminal of the AND gate is coupled to a control terminal of the D flip-flop.

2. The TDC circuit of claim 1, wherein the control terminal of the D flip-flop is a low-active SET terminal that sets an output terminal of the D flip-flop to a logic high state when the control terminal is in a logic low state.

3. The TDC circuit of claim 2, wherein during a self-test mode of the TDC circuit, the enable signal of the TDC circuit is configured to stay in the logic high state, the data signal is configured to stay in the logic low state, and the test signal is configured to changes from the logic high state to the logic low state at a first pre-determined time instant.

4. The TDC circuit of claim 3, wherein during the self-test mode, the test signal is further configured to:
   after changing from the logic high state to the logic low state at the first pre-determined time instant, change from the logic low state to the logic high state at a second pre-determined time instant.

5. The TDC circuit of claim 3, wherein during a normal operation mode of the TDC circuit, the enable signal of the TDC is configured to stay in the logic high state, and the test signal is configured to stay in the logic high state.

6. The TDC circuit of claim 3, further comprising a test signal generator configured to generate the test signal.

7. The TDC circuit of claim 6, further comprising an input/output (I/O) interface configured to receive an external test signal as the test signal.

8. A time-to-digital converter (TDC) circuit with self-testing function, the TDC circuit comprising:
   a sampling stage comprising:
   first plurality of D flip-flops, wherein first input terminals of the first plurality of D flip-flops are configured to be coupled to a data signal, wherein first clock terminals of the first plurality of D flip-flops are configured to be coupled to respective ones of a plurality of clock signals, wherein the plurality of clock signals have a same frequency but different phases; and
   a plurality of AND gates, wherein first input terminals of the plurality of AND gates are configured to be coupled to an enable signal, wherein second input terminals of the plurality of AND gates are configured to be coupled to respective ones of a plurality of test signals, wherein output terminals of the plurality of AND gates are coupled to respective ones of control terminals of the first plurality of D flip-flops.

9. The TDC circuit of claim 8, wherein the control terminals of the first plurality of D flip-flops are low-active SET terminals for setting output signals of the first plurality of D flip-flops to a logic high value when the SET terminals have a logic low value.

10. The TDC circuit of claim 9, wherein during a self-test mode of the TDC circuit, the enable signal is configured to be at the logic high value, the data signal is configured to be at the logic low value, and the plurality of test signals are configured to generate pulses at pre-determined time instants.

11. The TDC circuit of claim 10, wherein during a normal operation mode of the TDC circuit, the enable signal is configured to be at the logic high value, and the plurality of test signals are configured to be at the logic high value.

12. The TDC circuit of claim 10, further comprising a test signal generator configured to generate the plurality of test signals.

13. The TDC circuit of claim 10, further comprising:
   a re-sampling stage comprising second plurality of D flip-flops, wherein second input terminals of the second plurality of D flip-flops are coupled to respective output terminals of the first plurality of D flip-flops, wherein each of the second plurality of D flip-flops and a respective one of the first plurality of D flip-flops are clocked by a same respective clock signal of the plurality of clock signals.

14. The TDC circuit of claim 13, further comprising:
   a first synchronization stage comprising third plurality of D flip-flops, wherein third input terminals of the third plurality of D flip-flops are coupled to respective output terminals of the second plurality of D flip-flops, wherein a first group of D flip-flops of the second plurality of D flip-flops are clocked by a first clock signal of the plurality of clock signals, and a second group of D flip-flops of the second plurality of D flip-flops are clocked by a second clock signal of the plurality of clock signals.

15. The TDC circuit of claim 14, wherein a timing difference between the first clock signal and the second clock signal is equal to half of a clock cycle of the first clock signal.

16. The TDC circuit of claim 14, further comprising:
a second synchronization stage comprising fourth plurality of D flip-flops, wherein fourth input terminals of the fourth plurality of D flip-flops are coupled to respective output terminals of the third plurality of D flip-flops, wherein the fourth plurality of D flip-flops are clocked by the first clock signal.

17. A method of operating a time-to-digital converter (TDC) circuit having a self-testing function, the method comprising:
in a self-test mode of the TDC circuit, operating the TDC circuit by:
keeping an input terminal of a D flip-flop in an input stage of the TDC circuit in a logic low state;
sending a clock signal to a clock terminal of the D flip-flop;
keeping an enable signal at a first input terminal of an AND gate in a logic high state, wherein an output terminal of the AND gate is coupled to a control terminal of the D flip-flop; and
generating a pulse at a second input terminal of the AND gate at a pre-determined time instant.

18. The method of claim 17, wherein the control terminal is a low-active SET terminal of the D flip-flop.

19. The method of claim 18, further comprising:
in a normal operation mode of the TDC circuit, operating the TDC circuit by:
supplying a data signal to the input terminal of the D flip-flop;
sending the clock signal to the clock terminal of the D flip-flop;
keeping the enable signal at the first input terminal of the AND gate in the logic high state; and
keeping the second input terminal of the AND gate in the logic high state.

20. The method of claim 18, further comprising:
collecting output signals of the TDC circuit during the self-test mode;
comparing the collected output signals with expected output signals; and
in response to detecting a difference between the collected output signals and the expected output signals, declaring that the TDC circuit is faulty.

\* \* \* \* \*